United States Patent [19]

Papastavros et al.

[11] Patent Number: 5,056,996
[45] Date of Patent: Oct. 15, 1991

[54] APPARATUS FOR MANUFACTURING CONTINUOUS, SUPPORTED POLYMERIC SHEETS FROM POLYMERIZABLE LIQUID STARTING MATERIALS

[75] Inventors: Theodore G. Papastavros, Weston; Samuel A. Alexander, Concord; Michael D. Benedict, Quincy; Vincent Cioffi, Braintree; Russell B. Hodgdon, Sudbury; Emery Richard, Lynn, all of Mass.; Winslow F. Tinkham, Ocala, Fla.

[73] Assignee: Ionics, Incorporated, Watertown, Mass.

[21] Appl. No.: 660,124

[22] Filed: Feb. 25, 1991

Related U.S. Application Data

[63] Continuation of Ser. No. 404,939, Sep. 8, 1989, abandoned.

[51] Int. Cl.$^5$ ............................................. B29C 31/08
[52] U.S. Cl. ................................. 425/110; 156/275.1; 264/40.7
[58] Field of Search ............... 156/552, 544, 307.3, 156/275.1, 272.2; 264/288.4, 146, 290.2, 40.7; 425/110, 71

[56] References Cited

U.S. PATENT DOCUMENTS

| 2,483,014 | 9/1949 | Land et al. | 354/84 |
| 2,563,343 | 8/1951 | Land | 354/84 |
| 2,590,186 | 3/1952 | Land | 264/146 |
| 4,324,606 | 4/1982 | Withers | 156/272.2 |
| 4,372,800 | 2/1983 | Oizumi et al. | 156/307.3 |
| 4,539,793 | 9/1985 | Malek | 156/275.1 |
| 4,601,861 | 7/1986 | Pricone et al. | 425/71 |
| 4,656,814 | 4/1987 | Lockington | 156/275.1 |

FOREIGN PATENT DOCUMENTS

62-092829 4/1987 Japan .

Primary Examiner—Jay H. Woo
Assistant Examiner—W. J. Matney, Jr.
Attorney, Agent, or Firm—Norman E. Saliba

[57] ABSTRACT

This invention pertains to processes and apparatus for manufacturing supported, solid, polymeric sheets from: (I) liquids containing components reactable to polymers; and (II) one or more indefinitely long, foraminous substrates. A more or less continuous sandwich is formed of such substrate(s) and, faced on each side of the substrates as a group, film extending beyond the lateral edges of the substrate(s), the plane of the sandwich deviating from vertical by not more than about 45 degrees.

4 Claims, 2 Drawing Sheets

APPARATUS FOR MANUFACTURING CONTINUOUS, SUPPORTED POLYMERIC SHEETS FROM POLYMERIZABLE LIQUID STARTING MATERIALS

This application is a continuation of application Ser. No. 07/404,939, filed Sept. 8, 1989, now abandoned.

BACKGROUND OF THE INVENTION

1. Field of the Invention

The invention resides in the field of continuous processes and apparatus for making supported polymeric sheets including ion exchange membranes from polymerizable liquid precursors and continuous foraminous, solid substrates such as fabrics, paper and microporous diaphragms.

2. Description of the Prior Art

During the last four decades several million square feet of ion exchange membrane have been made from freely flowing solutions of functional or functionizable monomers, crosslinking monomers and low molecular weight, non-polymerizing diluents for said monomers. (See e.g. U.S. Pat. No. #2,730,768). The diluents are also characterized by being good swelling agents for the polymers eventually resulting from such monomers and by being readily leached out of such polymers. Almost all of such membranes have been reinforced with substrates such as woven or non-woven fabrics, paper or microporous diaphragms. The process generally comprised interleaving the substrates and glass plates in a pool of such solution in shallow trays, removing excess solution, polymerizing the monomers by heating the array of plates and substrates and subsequently disassembling the array to retrieve the polymer impregnated substrates. The glass plates were generally recycled. In some cases the polymer impregnated substrates were useful as ion exchange membranes after simple leaching in water (or other solvents and then water). In other cases functional monomers had first to be converted to suitable ion exchange groups (e.g. polyvinyl benzyl chloride-co-divinyl benzene to poly (N-benzyl-N,N,N-trimethyl ammonium chloride)-co-divinyl benzene). In yet other cases ion exchange groups had to be added to functionizable moieties (e.g. sulfonic acid groups to polystyrene-co-divinyl benzene).

Such process, as is, is inherently labor intensive and difficult to automate or robotize.

Processes for continuous polymerization are known. For example, Japanese Laid Open Patent 50-103585 describes method and apparatus for continuous polymerization in the absence of substrates in which both edges of a single continuous film are brought into contact in the longitudinal direction continuously to form a roughly circular tube. An aqueous solution of non-crosslinking monomers polymerizable to water soluble polymers and an aqueous solution of polymerization agent are supplied to the resulting tube and the polymerization of the monomers is carried out while the tube is moved by an endless belt. The tube is subsequently opened and the water soluble gel polymer recovered. The tube moved at 2 to 2.6 ft/hr. and the polymerization time was 4 to 5 hours. No support substrate is used.

European Patent Application 0 197 423 describes method and apparatus for continuous photopolymerization of vinyl and related monomers in aqueous solution in the absence of support substrates. The solution is deposited on a horizontal, endless, moving metal belt with continuous belt-like dams at the edges. The solution is covered with film such as nylon or polyester having a low permeability to oxygen and a high permeability to ultraviolet light.

U.S. Pat. No. 2,590,186 describes method and apparatus for forming a continuous, solid film from a solution or emulsion of an organic, high polymer, comprising advancing substantially vertically two individual continuous sheets together through a pair of horizontal squeeze rolls while feeding a solution or dispersion of the polymer between the converging inner surfaces of the sheets. At least one of the sheets is absorbent of the solvent or dispersant in the solution or dispersion resp. The solution or dispersion has a viscosity greater than 10 poise. No polymerization takes place. Dispersant or solvent (e.g. water) is absorbed from the dispersion or solution resp. by one or both of the sheets until the dispersant or solvent content of the solution or dispersion is such that it behaves as a solid. The ultimate product can be one of the absorbent sheets coated with polymer. The thickness of polymer is about 0.1 to about 0.4 mils. The lateral edges of the sheets are not at least temporarily sealed together at a distance above the squeeze rolls to make a pocket capable of holding free flowing liquid. The sandwich consists of the two sheets and therebetween the solution or emulsion of high polymer.

U.S. Pat. No. 3,732,193 describes a thin film polymerization method for making water soluble polymers and copolymers of water-soluble, ethylenic-unsaturated, non-crosslinking monomers comprising casting an aqueous monomer solution in the presence of a free radial initiator on an endless belt to form a thin film, then passing the film through a heated tunnel (having an inert gas blanket) to polymerize the aqueous monomer in the form of a thin film and finally drying the film. A foraminous substrate for the non-crosslinked, water-soluble polymer is not used.

U.S. Pat. No. 3,912,607 describes a process for making non-crosslinked, thermoplastic water-soluble acrylic polymers or copolymers by depositing a concentrated aqueous solution of the (non-crosslinking) monomers and a photo polymerization initiator on a non-foraminous non-absorbent, horizontal endless belt as a continuous layer, illuminating the layer while controlling the temperature of the layer by cooling.

U.S. Pat. No. 4,324,606 describes a process and apparatus for thermally laminating two or more preformed, non-crosslinked, thermoplastic polyperfluoro-cation exchange ionomer films at least one to each side of a woven fabric utilizing two sets of flexible endless belts to transport such laminate into and out of the thermal laminating zone, one belt of each set having a series of perforations along its entire length, each set of belts extending beyond the adjacent edge of the laminate. The fabric is wider than the films to permit air to be pumped out from between the films.

U.S. Pat. No. 4,372,800 describes a continuous process for producing reinforced resin laminates comprising the steps of impregnating a plurality of fibrous substrates with a liquid resin which is free of volatile solvent and capable of curing without generating liquid and gaseous by-products and then laminating the plurality of the resin-impregnated substrates into a unitary member. The unitary member is sandwiched by a pair of horizontal squeeze rolls having the plane of their axes in a vertical direction and between a pair of horizontal covering sheets and cured between the sheets without applying appreciable pressure. The process suffers from the problem of controlling the amount of liquid resin held on each substrate to be neither more nor less than that required by the sandwiched unitary member. U.S. Pat. No. 4,372,800 acknowledges that "insufficient resin contents result in poor quality of the product, while excessive resin contents often cause various disadvantages such as spilling of the liquid resin out from the edges of the uncured laminate and the like" (col. 20 line 27 et. seq.). Further the thin, impregnated sheets offer a large area to the air before the sandwiching step, permitting the sorption of oxygen, the latter interferring with subsequent free radical curing steps. In addition the impregnated substrates are directed by other rollers from the impregnating means to the sandwiching squeeze rolls. Such directing rollers are also a mechanism for sorbing oxygen into the liquid resin, tend to build up tacky resin and can only be described as operationally messy and unsatisfactory. These problems are all solved in the present invention by first forming a sandwich of substrate(s) and covering sheets, said sandwich being substantially vertically oriented (e.g. deviating from the vertical by not more than about 45 degrees), sealing at least temporarily the edges of the covering sheets to each other to form a pocket above substantially horizontally oriented squeeze rolls having the plane of their axes substantially horizontal and feeding the polymerizable liquid to the pocket in the region thereof where the covering sheets converge between the squeeze rolls. In this way the sandwich of substrate(s) and covering sheets takes exactly that amount of liquid which is required by the wettable volume between the covering sheets, no more or no less and large areas of impregnated substrate are not exposed to air. The wettable volume between the covering sheets in the present invention is of course determined by the gap between the squeeze rolls, the thickness of the covering sheets (films, foils), the total thickness of the support substrate(s) and the wettable void volume of the latter as will be more fully described below.

DESCRIPTION OF PREFERRED EMBODIMENTS

Figure 1:
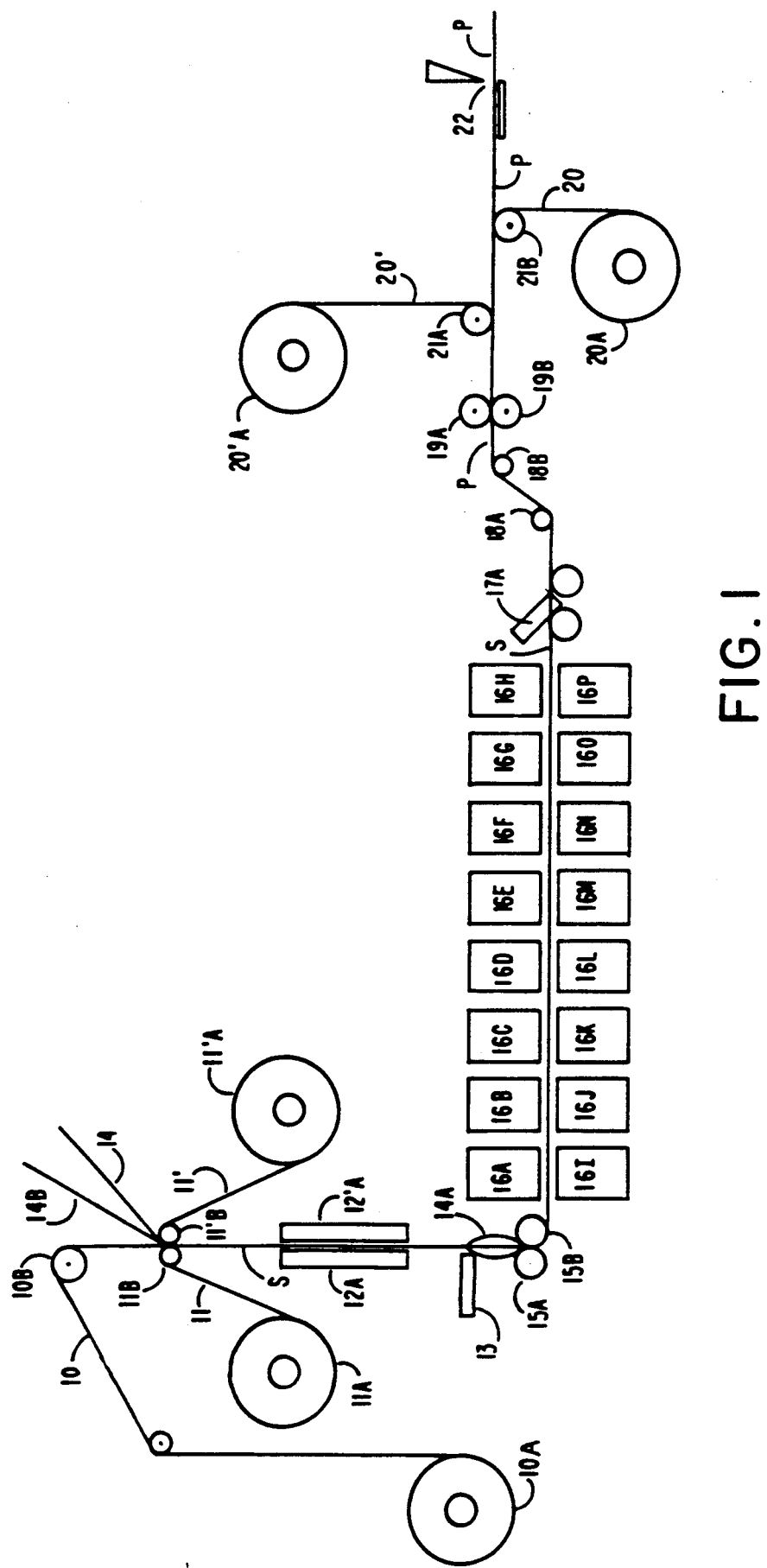
FIG. 1 is a schematic representation in vertical cross-section of a preferred apparatus according to the invention.
Figure 2:
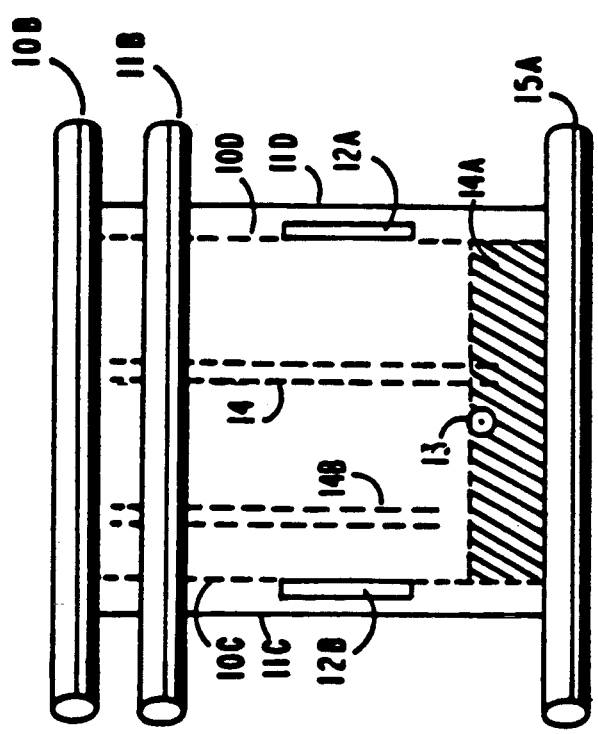
FIG. 2 is a schematic representation in a vertical cross-section (perpendicular to the section of FIG. 1) showing a preferred arrangement of items 10b, 11b, 12a, 14, 14a, 14b, and 15a of FIG. 1.

Referring to FIGS. 1 and 2, the numeral 10 indicates a continuous, pliable substrate or pack of such substrates, each having a multiplicity of apertures extending from one surface through the body of the substrate to the other. The substrate may be, for example, woven or non-woven fabric, paper (including synthetic paper), microporous diaphragm and the like. The substrate should be insoluble in but wettable by the polymerizable liquid (see below) at the temperatures and in the times encountered in the manufacturing process. In addition it should be reasonably stable under the use conditions likely to be encountered by the finished, supported, solid polymer sheet which is the product of the apparatus. Obviously the choice of material of construction of the substrate depends, inter alia, on the composition of the polymerizable liquid which will be used to make the supported polymer sheet as well as, as noted, on the polymerization temperature and time. Examples will be given below. For any polymerizable liquid suitable substrates can be easily chosen by preliminary trials. Substrate(s) 10 are played out from substrate(s) roll 10a. Substrate or substrate pack 10 passes over roll 10b and continues downwardly in a generally vertical direction between generally horizontal rolls 11b and 11'b. The plane defined by the axes of rolls 11b and 11'b need not be generally horizontal. Numerals 11 and 11' represent pliable films or foils having compositions which are not soluble or substantially swollen in the polymerizable liquid at the operating temperatures and within the operating times of the apparatus. In addition they should release relatively easily from the finished polymer sheet as will be more fully discussed below. Further they should have low permeability to any volatile components of the polymerizable liquid and preferably to oxygen from the air. Suitable films or foils comprise, for example without limitation, polymers such as polyethylene terephthalate, cellulose acetate, cellulose triacetate, polytetrafluoroethylene-cohexafluoropropylene, polytetrafluoroethylene, polytrifluoro chloro ethylene, nylon 6, nylon 6,6, nylon 11, nylon 12, polyethylene-comethacrylic acid salt, polycarbonate, polyimide, polypropylene, polyvinyl alcohol and metals such as aluminum, copper, stainless steel and phosphor bronze. The films (foils) 11 and 11' are played out from film rolls 11a and 11'a over rolls 11b and 11'b respectively, continuing downwardly in a generally vertical direction between said rolls on each side (face) of substrate(s) 10, forming initially at rolls 11b and 11'b a loose sandwich. Although a single substrate or pack of substrates are shown by the numeral 10 and a single roll of substrate or pack by the numeral 10a, more than one such roll and more than one such substrate or pack of substrates may be combined by roll 10b or other similar rolls into the sandwich optionally interleaved as desired by additional foils. The position of the rolls 10a, 11a and 11'a are not critical to the invention as long as topologically substrate 10 can be fed between films 11 and 11'. Thus for example, the exact positions of rolls 10a and 11a shown in FIG. 1 cannot be interchanged.

The linear vertical speeds of substrate(s) 10 and films 11 and 11' are equal, at least below rolls 11b and 11b'. The width of substrate 10 is less than that of films 11 and 11' as shown in FIG. 2 by the respective lateral edges designated respectively 10c and 10d on the one hand and 11c and 11d on the other. (Film 11' is not visible in FIG. 2), essentially registering with film 11 and lying behind the latter in FIG. 2. The average plane of the loose sandwich formed below rolls 11b and 11'b is preferably within about 45° of vertical. Within such preferred limitation the sandwich passes substantially vertically downward to and between squeeze (nip) rolls 15a and 15b. Between the pair of rolls 11b and 11'b on the one hand and the pair 15a and 15b on the other the lateral edges of films 11 and 11' are caused to be at least temporarily joined, composited or sealed, for example, pertaining to the near lateral edges of films 11 and 11' in FIG. 1, by means 12a and 12'a. It will be understood that similar means are employed with respect to the far lateral edges of films 11 and 11' as indicated by 12b in FIG. 2, a component corresponding to 12'a in FIG. 1 lying behind 12b in FIG. 2. Such means may for example, be heat sealing means such as those described in U.S. Pat. No. 4,502,906 in which case such means should be designed to stretch films 11 and 11' substantially taut laterally before and/or during the sealing or joining operation. The purpose of the sealing or joining is to avoid substantial seepage and/or weeping of polymerizable liquid out of the sandwich comprising films 11, 11' and substrate(s) 10 at least before nip rolls 15a and 15b. The joining preferably continues after such rolls unless such liquid is sufficiently viscous to resist seepage and/or weeping inherently or until it becomes so viscous. The seal may comprise male-female engaging grooves in which case rolls 15a and b as well as other rolls may contain grooves to accommodate date such locks. The seal may be accomplished by setting and non-setting adhesives which are applied or transferred to the lateral edges (or near such edges) of films 11 and 11' by such sealing means applied or transferred to the films before such sealing means or may be an integral part of the films on rolls 11a and 11'a. In the latter case at least the adhesive area may be covered by release film or alternatively the region of the film on the opposite face of the film from the adhesive area may be naturally an abherent (i.e. release) surface or treated to be such. It will be understood that if the material of films 11 and 11' is naturally abherent to a desired adhesive then the area of the films to which the adhesive will be applied will generally be treated to promote adhesion. Similarly if it is desired to use hot wire, ultrasonic or other heat sealing and the materials of films 11 and 11' are not naturally heat sealable then at least the area to be sealed may be treated to promote such heat sealing.

As a further example the seal may be made by sewing or stitching preferably using an easy-opening stitch. The seals may also be provided by belts pressing against areas of the films at or near the lateral edges of the films, such belts beginning above squeeze rolls 15a and b, e.g. in the region of 12a and 12'a and continuing at least through squeeze rolls 15a and b. In such case grooves may be provided in the latter rolls to accommodate such belts. The belts may be firmly pressed against films 11 and 11' by closely spaced small diameter wheels or rollers, abherent bars and the like.

The effect of the temporary or permanent seal between the two films 11 and 11' at their lateral edges is to create a pocket in the sandwich S above squeeze rolls 15a and 15b. One or more conduit means 14 extend toward or into said pocket as indicated in FIGS. 1 and 2. Conduit means 14 must of course enter said sandwich before the edge seals are formed, for example from above between guide rolls 11b and 11'b in which case either the gap between such rolls must be sufficient to accommodate such conduit means (including displacing rolls 11b and 11b' vertically from each other) or one or both rolls may have appropriate grooves. Conduit means 14 may also enter from the side of sandwich S below rolls 11b and 11b' but above the sealing means. Only one such conduit means 14 is shown in FIGS. 1 and 2 but it is clear that more than one may be used. For example there may be conduit means 14 on each side of substrate 10 and/or distributed along the width of said substrate. The function of said one or more conduit means 14 is to introduce polymerizable liquid into the pocket of the film-substrate(s)-film sandwich to create a shallow pool of polymerizable liquid along substantially the whole width of substrate 10 and in the region in which the films and substrate(s) converge into the gap between squeeze rolls 15a and b. Such pool is indicated by numeral 14a. Conduit(s) 14 may have any suitable cross-section e.g. that of an essentially cylindrical tube or a flattened tube. The dimensions of conduit(s) 14 depend on the specifics of the manufacturing process. For example if substrate 10 is about 44 inches wide, moves at a rate of 60 inches per minute, has a void volume of about 67 percent and a nominal thickness of about 0.020 inches then the necessary flow of polymerizable liquid will be about 0.6 liters per minute. Further if the length and diameter of conduit 14 are about 1 meter (39 inches) and about 0.2 cm resp., the density and viscosity of the polymerizable liquid are 1 g/cm$^3$ and 1 centipoise resp., then the pressure loss in such conduit will be about 5 psi. If the viscosity is instead about 10 poise then at the same volumetric flow rate the pressure loss in conduit 14 will be about 15 psi if the internal diameter of said conduit is about 0.8 cm. It might be preferable to use ten conduits 14 each about 0.5 cm internal diameter, therefore also achieving better distribution of such more viscous polymerizable liquid along pool 14a.

The level in pool 14a may be controlled visually, by a precision metering pump, a constant head device (such as a constantly overflowing head tank or a pneumatic blowcase, the latter with direct inert gas pressurization from the pressurizing fluid), by feeding excess to the pool and continuously sucking out such excess through conduit 14b and/or by a level sensing means indicated by numeral 13. The latter is shown as outside sandwich S but may equally be inside such sandwich. Suitable level sensors include ultrasonic devices utilizing a piezoelectric transmitter and receiver; capacitance devices based on the difference in dielectric constant between the polymerizable liquid pool and the gas/vapor space above it; inductive devices based on the difference in electrical conductivity between the pool and the gas/vapor space. Signals from such sensors can be used to activate on-off flow control valves, proportional valves, on-off metering pumps, proportional metering pumps by control schemes well-known in the art. Particularly preferred are control systems in which the main flow at a value slightly below the average flow is provided by a principal flow-control valve or metering pump and a much smaller flow in parallel to the main flow is regulated through the agency of sensing means 13.

As substrate 10 passes through pool 14a air (or other gas or vapor) in the apertures of the substrate is displaced at least in part in substantially all, preferably all of said apertures by polymerizable liquid. The rate and efficiency at which such displacement occurs depends, inter alia, on the average size and distribution of sizes of apertures in such substrate, on the viscosity of the polymerizable liquid and on the interfacial tension between said liquid and the material of the substrate. It is found however that when the height of pool 14a is in the range of 10 to 30 cm above the plane tangent to the uppermost surfaces of rolls 15a and b and the speed of substrate 10 is in the range of from about 1 to about 10 cm/sec then efficient displacement of gas or vapor can generally be obtained with suitable substrates and polymerizable liquids having viscosities less than about 10 poise.

The gap between squeeze rolls 15a and b is preferably set to be approximately equal to the sum of the nominal thicknesses of the films 11 and 11' and substrate or substrate pack 10. If the gap is much smaller than said sum then the texture of the surface of the finished polymer sheet will be essentially that of the surface of the substrate. If the gap is much larger than said sum there may be an unnecessary and often undesirable thick layer of unsupported polymer on the surfaces of the finished polymer sheet. One or both of said rolls 15a and b may be of an elastomeric material or covered on the curved surface with such material and the other, if not comprising such elastomeric material, then of a hard material such as aluminum, stainless steel, fiber reinforced polymers such as polyester, epoxy, phenolic or aminoplast resins. It is preferred if roll 15a has at least 1 centimeter of the surface consisting of 20 to 40 Shore A durometer elastomer and roll 15b has at least the surface consisting of the above mentioned hard material. Preferably rolls 15a and b are designed to spread films 11 and 11', i.e. to make them taut laterally. The plane of the axes of rolls 15a and b should be substantially perpendicular to the plane of substrate 10 immediately above such rolls, i.e. the plane of the axes will generally deviate from horizontal in the same direction and by about the same angular quantity as the substrate varies from vertical as discussed above.

The sandwich S issuing continuously from rolls 15a and b thus consists of substrate(s) substantially impregnated with polymerizable liquid with covering, pliable films or foils 11 and 11' in contact on each side. The polymerizable liquid is then allowed or caused to cure to at least to the glassy, gel or solid state. The polymerizable liquid may be self-curing at ambient temperature or formulated including polymerization initiators, catalysts and/or promoters and/or inhibitors effective at ambient temperature. In the latter case it is preferred that such agents be added to and thoroughly mixed into the polymerizable liquid only shortly before such liquid enters conduit(s) 14. Nevertheless pool 14a constitutes a "feed-and-bleed pot" and the mixture of polymerizable liquid and polymerization agent must have a suitable pot life. This may be obtained by including a suitable consumable polymerization inhibitor which delays onset of ambient temperature polymerization. Polymerization is generally a more or less exothermic process. If the polymerizable liquid comprises vinyl or related monomers and/or unsaturated polymers and a free radical polymerization initiator or initiator system then it may be necessary to cool the sandwich emerging from rolls 15a and b in order to avoid generation of free radicals more rapidly than they can be efficiently used by the polymerizable liquid.

Generally the apparatus and process will be easier to control if the polymerizable liquid does not spontaneously polymerize at ambient temperature or contain substantial amounts of polymerization agents effective at ambient temperature. In such case the polymerizable liquid may spontaneously polymerize or cure at an elevated temperature and/or it may be formulated with polymerization initiators, promoters and/or catalysts effective at such temperatures. In many cases such polymerization initiators function by means of and through free radicals produced by spontaneous decomposition of the initiators into free radicals. The rate of such decomposition at a given temperature depends on the chemical identity of the initiator and for a given (i.e. specific) initiator increases strongly with temperature.

Such initiators are frequently classified in terms of the temperature (°C) at which the first order half-life is 10 hours for example:

| | |
|---|---|
| bis(4-tertiary butyl-cyclohexyl)peroxy dicarbonate: | 50 |

| -continued | |
|---|---|
| 2,2 azobis[2,4-dimethyl]pentane nitrile: | 52 |
| di(2,4-dichlorobenzoyl)peroxide: | 54 |
| 2-(tertiary butylazo)-4-methoxy-2,4-dimethyl pentane nitrile: | 55 |
| dilauroyl peroxide: | 62 |
| 2,2'-azobis(isobutyronitrile): | 64 |
| diacetyl peroxide: | 69 |
| 2-(tertiary-butylazo)-2,4-dimethyl pentane nitrile: | 70 |
| dibenzoyl peroxide: | 73 |
| 2-(tertiary-butyl azo)isobutyro-nitrile: | 79 |
| 2-(tertiary butyl azo)-2-methyl butane nitrile: | 82 |
| 1,1 di(tertiary butyl peroxy)cyclohexane: | 95 |
| 1-(tertiary butyl azo)cyclohexane carbonitrile: | 96 |
| 1-(tertiary amyl azo)cyclohexane carbonitrile: | 99 |
| tertiary butyl perbenzoate: | 105 |
| dicumyl peroxide: | 115 |
| di-tertiary butyl peroxide: | 126 |

As pointed out above polymerization is generally a more or less exothermic process. At least in the case of polymerization initiated by free radicals this circumstance frequently results in a more or less sharp peak in the temperature of the polymerizing material which may be explained as follows: As the temperature of the polymerizable material rises from external heating to about that corresponding to the 10 hour half life the free radical initiator begins to decompose at a rate of about 0.1 percent per minute. If the concentration of initiator is sufficiently high, the efficiency of the radical also high (in terms of number of chemical bonds formed per radical) and the heat of polymerization is high, then the temperature of the polymerizing material can increase rapidly. In a typical case if the temperature increases to a value about 30° C. higher than the temperature corresponding to the 10 hour half life then the decomposition rate of the initiator will increase to about 5 percent per minute and 90 percent of the initiator will decompose in less than hour. Such high rate can be quite inefficient. A high concentration of free radicals (whether as initially formed radicals or radicals on polymer chains) can lead to recombination of radicals rather than addition of monomeric units to the radicals and, in the case of some initiators, such high concentration can result in second order decomposition of the initiator without formation of additional free radicals. In the traditional method of making isoporous, gel-type membranes by interleaving glass plates and substrates saturated with polymerizable liquid, the problem of extreme exotherm and inefficient use of initiator has been solved by using a low rate of heating, a long period of polymerization (several hours), a moderate amount of initiator, relying on the heat capacity of the glass plates to achieve a maximum exotherm temperature of not more than about 40° C. above the temperature corresponding to the 10 hour half-life temperature. In contrast, in the method and apparatus according to the present invention, one would like to achieve a relatively high linear production rate of polymer sheet in an apparatus of reasonable length, i.e. to achieve gelation and preferably the final stage of cure in the range of from about 10 to about 100 minutes. Such is very difficult to achieve using a single polymerization initiator since a combination of initiator concentration and temperature which will lead to early onset of polymerization may also lead to an excessive exotherm. It is preferred according to the apparatus and process of this invention to use two or more polymerization initiators differing in temperatures corresponding to a 10 hour first order half-life by at least about 10° C. and preferably by not more than about 15° C. Preferably the lowest (lower) 10 hour-half-life-temperature in said combination of initiators is not less than about 10° C. greater than ambient temperature. For example one may choose 2-(tertiary butyl azo)-4-methoxy-2,4-dimethyl pentane nitrile, dilauroyl peroxide or 2,2'-azobis (isobutyronitrile) as the lower temperature initiator and dibenzoyl peroxide or 2-(tertiary-butyl azo) isobutyronitrile as the higher temperature initiator. As an example of a combination of three initiators one might choose di(2,4-dichlorobenzoyl)peroxide, 2,2'-azobis(isobutyronitrile) and 2-(tertiary butyl azo)-2-methyl butane nitrile. There is of course no disadvantage (nor great advantage) in blending in appropriate proportions all of those free radical initiators tabulated above or a selection spanning the desired polymerization temperature range. The "low temperature" initiator may be a photoinitiator such as:

benzoin ethyl, isopropyl and/or methyl ether
4,4'-bis(dimethyl amino)-benzophenone
2-(n-butoxy)ethyl-4-dimethyl amino benzoate
dl-camphorquinone
2,2'-diethoxyacetophenone
4,4'-dimethoxybenzoin
2,2'-dimethoxy-2-phenylacetophenone
1-hydroxycyclohexyl phenyl ketone
2-hydroxy-2-methylphenylpropane-1-one
methyl benzoyl formate As is well known in the art some of the above photoinitiators require a hydrogen donor or co-initiator, which may be inherent in the polymerizable liquid or added for the purpose e.g. primary or secondary alcohols or ethers, thiols or tertiary amines in which at least one of the substituents is a primary or secondary aliphatic group. Photosensitizers such as thioxanthone, eosin or methylene blue may be useful.

Such photoinitiators advantageously result in rapid initiation of polymerization. Since part of the polymerizable liquid may be in the shadow of the substrate, it is preferred to use a thermally activated initiator (such as 2,2'-azobis(isobutyronitrile) and/or 2-(tertiary-butyl azo)isobutyronitrile the choice depending on the exotherm generated by the photoinitiation) to complete the polymerization.

The first stage initiator may be a promoted or redox free radical initiator such as cumene hydroperoxide, 1-butyl peroxy-2-ethyl hexanoate or 1,1-bis(tertiary butyl peroxy)-3,3,5 trimethyl cyclohexane plus a transition metal salt (e.g. cobalt naphthenate); dibenzoyl peroxide plus dimethyl aniline; paramenthane, cumene or tertiary butyl hydroperoxides plus e.g. dodecyl mercaptan. When such promoted or redox systems are used then one part of the system, preferably the promoter or reducing agent, should be added with thorough mixing to the polymerizable liquid just before it enters conduit(s) 14 in order to minimize the extent of polymerization in pool 14a.

Particularly useful in this invention are di- and triperoxides having two or more different peroxide types in the same molecule which decompose sequentially. Also particularly useful are initiators which can function both as photo- and thermal-initiators e.g. di-tertiary butyl peroxide.

It may be apparent from the above discussion that it may be very important to control the temperature in the polymerizing liquid in sandwich S issuing from squeeze rolls 15a and b in order to effect efficient use of polymerization initiator and high degrees of polymerization per gram-equivalent of initiator and/or per unit of light and/or thermal energy. In addition such control may be necessary to avoid damage to the substrate 10, the cover films 11 and 11' and/or volatilization of components of the polymerizable liquid. Thus for example it may be necessary to cool sandwich S at the same time as it is being irradiated to cause polymerization or first to heat such sandwich to initiate polymerization and then to cool it to avoid excessive exotherm. Detailed, specific instructions cannot be given since the exotherm depends, inter alia, on: the rate of irradiation (in photoinitiation); the concentration of initiators; the group (if any) of initiators used; the rate of heating; the heat of the polymerization reaction; the linear velocity of the sandwich S; the heat capacity of the sandwichs and the heat capacity and thermal conductivity of any parts of the apparatus which come in contact with the polymerizing sandwich. To effect such temperature control it is preferred that immediately downstream (below) squeeze rolls 15a and b the direction of transit of sandwich S be changed from substantially vertical to substantially horizontal as shown in FIG. 1. As shown in such figure 16a through 16p represent a group of means for irradiating, heating and/or cooling sandwich S. The nature and number of such means will depend strongly on the details of the polymerizing system and although 16 such individual means are shown there may in any specific embodiment of the invention be more or less (including none at all) and any or any group may be omitted. For example 16a through h may be omitted and heating and/or cooling accomplished through means 16i through p only. Means 16i through p may also support moving sandwich S in which case some at least of 16i through p may have only a support function. By way of example (without limitation) 16a, b and c may constitute a group of medium pressure mercury lamps having quartz or Vycor envelopes and operating at roughly 80 watts per centimeter of arc. They may be of the electrode or electrodeless type. In either case means 16i through l and 16d may be cooling means, e.g. internally cooled with water, chilled water or refrigerant. 16d may be one or more fans or blowers for cooling air or one or more outlets for pressurized air. Continuing, 16e through h may be electrically activated, controlled, infra red heating elements or such elements may be in direct contact with sandwich S and heated electrically, with hot water or other heat transfer means or with steam. Means 16e through h may constitute part or all of the high temperature sink of a heat pump or refrigeration machine cooling means 16c through l as mentioned above. If elements 16i through h are heating means then 16m through p may individually be only support means or may also be heating means.

By way of additional non-limiting example: 16i, k, m and o may be individually controlled heating means in direct contact with sandwich S; 16b, d, j and l may be individually controlled cooling means; 16a, c, and e may be inert (i.e. neither heating or cooling) but exert moderate pressure on sandwich S., 16n and p may be inert, support means; and elements 16f through h omitted.

By way of further non-limiting example, elements 16a, b and/or c may be Electrocurtain (TM) processors (e.g. Energy Sciences, Woburn, Mass., U.S.A.); multiple planar-cathode processors; infra-red radiators; microwave or radio frequency processors (including glow discharge processors); gamma ray (e.g. cobalt 60), X-ray or electron beam processors.

Alternatively elements 16i through p may be air diffusers providing a cushion of air on which sandwich S floats, the temperature of air issuing from each element being controlled to give the desired temperature profile in sandwich S. Elements 16a through h may then be at least in part other polymerization initiators e.g. u.v. and/or i.r. emitters.

Whether the polymerization of the sandwich S is carried out in a substantially horizontal course (as described above) or in a substantially vertical run (i.e. as a more or less direct extension of the plane of S above rolls 15a and b depends primarily on the viscosity and capillary effects of the polymerizable liquid in the sandwich S below rolls 15a and b. If such viscosity and capillary effects permit slumping or sagging of such liquid in the sandwich below rolls 15a and b then it is preferable that polymerization be carried out in a more or less horizontal plane as illustrated in FIG. 1. Even in the latter case the angle which the sandwich makes with dead horizontal need not be zero. Further the plane of the sandwich between elements 16a through h on the one hand and 16i through p on the other may be slightly curved in two dimensions, i.e. in the machine direction and in the transverse direction in order to achieve uniform profile in the finished sheet. The optimum angle of the sandwich with horizontal (in the case of very fluid polymerizable liquids having little capillary interaction with the substrate(s) and covering films) seems to depend on the details of the interaction of the components of the sandwich during polymerization, possibly on the differential thermal expansion of the components, the moduli of the substrate(s) and the films as well as on the tension applied to the films. Similar empirical factors seem to affect the choice of machine direction curvature (if any) of the sandwich and camber (if any).

For control of the temperature of the polymerizing liquid in the sandwich the temperature may be measured for example between elements 16a through h by means of one or more non-contact radiation or contact thermometers well known in the art, the readings therefrom being used manually or automatically to control the heat input from or to the various elements 16a through p.

Preferably those of elements 16a through p which come in direct contact with sandwich S are thinly coated with an abherent material i.e. one having a low coefficient of friction with the materials of films 11 and 11' for example polytetrafluoroethylene, perfluoro ethylene-propylene copolymer, graphite. Alternatively said elements can be separated from films 11 and 11' by films of such low coefficient of friction materials anchored to the apparatus and/or to said elements. A preferred material is Kapton (TM) polyimide film coated with polyperfluoroethylene-propylene copolymer (duPont Co., Wilmington, Del., U.S.A.).

The presence of oxygen is undesirable in many polymerizable liquids useful in the present invention since, for example, if a free radical type polymerization initiator is used such oxygen can readily add to the growing polymer chain to form a peroxy radical. Frequently however polymer chain ending in such radical does not readily continue to grow and so the rate of polymerization of said liquids decreases. The addition of oxygen to the polymer chain results through such mechanism in a lower degree of effective crosslinking of finished polymer. Further the oxygen inclusions are often subject to scission under the conditions pertaining to the end use of the finished polymer sheet. Hence it is generally desirable to remove oxygen from the polymerizable liquid prior to introducing such to the apparatus of this invention through conduit 14 of FIGS. 1 & 2. If desired conduit 14b or a similar conduit can be used to flush the surface of pool 14a with an inert gas such as nitrogen to prevent any subsequent absorption of oxygen i.e., from that occluded in substrate 10.

Referring again to FIG. 1, 17a indicates means to remove the seals made by means 12a and 12'a on the near edges of films 11 and 11', it being understood that there are similar seal removing means lying behind mean 17a in FIG. 1 to remove the seal from the far edge of films 11 and 11'. If the seals have been made by setting adhesives, thermally or by stitching then 17a may be, for example, a stationary or rotary knife. If the seals have been made by male-female interlocking grooves, by stitching or non-setting adhesive then 17a is means for separating such. Although 17a and b are shown in FIG. 1 to be immediately down-stream of elements 16a through p, it may in fact be positioned much later in the apparatus at any point prior to stripping roll 21a (see below) and in the case where the polymerization of the sandwich is carried out in a generally squeeze rolls 15a and b and elements 16a and i. The latter point may appear surprising but it must be remembered that the polymerizable liquid is held by capillarity and viscous inertia in the sandwich as it is in the traditional method of polymerizing in substrates between glass plates described above. If the sealing means has been provided by belts bearing against the areas of the films 11 and 11' near or at the lateral edges of such films (as described above in connection with the discussion of the sealing means) then 17a (and its counterpart on the far edges of films 11 and 11') are the disengagement and return rollers for such belts.

Rolls 18a and b are adjustable guide rolls actuated by manual or automatic sensing from the edges of films 11 and 11' and intended to maintain a straight (unskewed) transit of sandwich S through the apparatus of this invention.

Rolls 21a and b strip films 11' and 11 respectively from polymer sheet P, such film then being rewound on rolls 20'a and 20a respectively. It will be clear that if the joints or seals made at or near the edges of foils 11 and 11' are not permanent then one or both such foils can be reused perhaps after some cleaning, i.e. rolls 20a and/or 20'a eventually moved into position 11a or 11a'. Alternatively such foils (again after any cleaning) can be, in such case, recycled as endless belts. On the other hand if the joints or seals are permanent and the sandwich S is opened by removing the edges then rolls 20a and/or 20'a can nevertheless be reused on a companion apparatus having an appropriate narrower width.

It is clear from an inspection of FIG. 1 that during the operation of the apparatus the angular velocities of rolls 10a, 11a and 11'a increase while the angular velocities of rolls 20'a and 20a decrease. Hence it is preferred that the rates of transit of sandwich S through the apparatus be controlled by a pair of squeeze rolls 19a and b, at least one of which is driven. Preferably rolls 19a and b are pushed together by adjustable hydraulic or pneumatic rams the pressures of which may be manually or automatically controlled. Preferably at least one of said rolls is of elastomeric material or covered on the curved surface (preferably to a depth of at least one centimeter) with such material and the other, if not comprising elastomeric material, then of hard material such as that described in connection with rolls 15a and b. Rolls 20'a and 20a are preferably also driven, but through adjustable friction couplings (friction clutches) controlled manually or preferably automatically to take up films 11' and 11 (i.e. 20' and 20 respectively) at the rate at which such films are being made available by rolls 19a and b even though the diameters of rolls 20'a and 20a are changing during the operation of the apparatus.

Generally rolls 10b, 11b and 11b', 15a and b, 18a and b, and 21a and b are idling (i.e. neither driven or braked) whereas rolls 10a, 11a and 11'a are braked through adjustable friction couplings (friction brakes) controlled manually or preferably automatically to maintain taut substrate(s) 10 and films 11 and 11' respectively. The degree of braking of the last three mentioned rolls is critical, excessively high or low braking resulting in non-uniformity of the profile of the finished polymer sheet P. Owing to the interaction of many process and apparatus parameters it is not possible to give exact instructions for the optimum tension on substrate(s) 10 and/or films 11 and 11'. However the adjustment of the brakes can be easily made within a reasonable time by observing the effects on the above mentioned profile.

Within the scope of this invention is included the possibility of driving any and all rolls with variable speed drives, e.g. with geared, compound wound d.c. motors controlled by thyristors, or geared, variable frequency a.c. motors, such motors responding to strain (e.g. tension) measurements on substrate(s) 10 and/or films 11 and 11'.

In some applications polymer sheet P and film 20 (i.e. 11) and/or film 20' (i.e. 11') may be wound together on one roll 20a or 20'a, for example all three (P, 20 and 20') may be wound on roll 20a or polymer sheet P and film 20' may be wound together on roll 20'a. Such may be the case for example if it is desired to continue the polymerization of polymer sheet P, in roll form in a hot air oven, steam autoclave or hot water bath. It may also be the case when it is desired to process the polymer sheet P in other apparatus, for example, to remove leachable diluents; to saponify (hydrolyze) sulfonate or carboxylate ester groups; to add sulfonic acid groups; to add haloalkyl groups; to aminate haloalkyl groups; or to quaternize amine groups in the polymer sheet P.

Alternatively polymer sheet P with or without one or both films 20 and 20' may be cut into suitable lengths manually or automatically by cutting means (shear, guillotine etc. 22) well known in the art. The thus cut polymer sheets P may be useful as such, may be further cured or polymerized, leached or otherwise processed as noted above.

EXAMPLE 1

Liquid characterized by having a viscosity less than about 10 poise at shear rates in excess of about 1 cm/sec and comprising at least in part components reactable to form polymer is prepared from about:

| | |
|---|---|
| 54.6% divinyl benzene of commerce: | 16.6 liters |
| vinyl toluenes: | 5.5 liters |
| dixylyl ethane: | 18.9 liters |

The mixture is treated with De-Hibit 100 ion exchange resin to remove inhibitors and there are added as polymerization initiators about:

| | |
|---|---|
| bis(4-tertiary-butyl-cylcohexyl) peroxy dicarbonate | 650 grams |
| dilauroyl peroxide | 410 grams |
| dibenzoyl peroxide | 410 grams |

The mixture is thoroughly deoxygenated by spraying into a vacuum chamber having a pressure of about 2 mm Hg absolute. The mixture is fed to an apparatus according to FIG. 1 through conduit means 14. Films 11 and 11' are Mylar (TM) type M (duPont Co., Wilmington, Del., U.S.A.) 3 mils thick and 24" wide. Substrate 10 is an acrylic plain weave fabric 20 inches wide having a thread count of about 24 by 22.5 per inch, weight of about 4 ounces per sq. yd. and a thickness of about 19 mils. The yarn is spun from staple. The linear velocity is adjusted to give a polymerization time of about 25 minutes. Element 16a is inert and exerts a pressure of about 4 grams per cm$^2$ on sandwich S. Elements 16b and d are fans, regulated manually to control the temperature of sandwich S. Elements 16c and e are inert and exerts a pressure of about 0.6 gram per cm$^2$ on sandwich S. Elements 16f, g, h, o and p are omitted. Elements 16i through n are heated electrically to cause the temperature of sandwich S to increase from about 60° C. at element 16i to about 110° C. at element n. Elements 16a through e and i through r are separated from sandwich S by Kapton abherent film anchored to the apparatus.

Means 12a and b and 12'a and b are heat welding elements according to U.S. Pat. No. 4,502,906. Element 13 is a capacitative sensor from Efector, Inc. Rolls 15a and 19a are covered with 30 durometer rubber to a depth of at least one centimeter. Rolls 15b and 19b are chrome steel. The edges of the sandwich are slit by element 17a and a corresponding element at the far edge of the sandwich S and films 20 and 20' (i.e. 11 and 11') taken up by rolls 20a and 20'a respectively. Polymer sheet P is cut by shear 22 into lengths of about 40 inches each. The resulting sheets are leached in methylene dichloride and sulfonated according to U.S. Pat. No. 2,962,454. The resulting cation exchange membranes have ion exchange capacities of about 2.8 milligram equivalents per gram of dry sulfonated polymer in sodium form (i.e. not including substrate) and water contents of about 50 percent of wet sulfonated polymer in sodium form (again not including substrate). The membranes are useful in the electrodialytic production of potable water from brackish water.

The temperatures corresponding to the 10 hour first order half lives of the polymerization initiators are about 50°, 62° and 73° C., i.e. the differences lying in the range of from about 10° to about 15° C.

EXAMPLE 2

The preparation of polymer sheets according to Example 1 is repeated except the polymerization initiator system consists of about:

| | |
|---|---|
| bis(4-tertiary-butyl-cyclohexyl) peroxydicarbonate | 650 grams |
| dibenzoyl peroxide | 825 grams |

It is found that under the time-temperature conditions of Example 1 the polymer sheets are not completely polymerized. The cut polymer sheets are interleaved with Mylar film and cured in a hot air oven at 110° C. Subsequently the cured polymer sheets are leached and sulfonated as in Example 1. The properties of the finished cation exchange membranes are essentially the same as those obtained in Example 1. The temperatures corresponding to the 10 hour half lives of the polymerization initiators differ by more than about 15° C. The membranes are useful in electrodialysis.

EXAMPLE 3

Liquid characterized by having a viscosity of less than about 10 poise at shear rates in excess of about 1 cm/sec and comprising at least in part of components reactable to form polymer is prepared from about:

| | |
|---|---|
| 55% divinyl benzene of commerce: | 43.0 liters |
| vinyl toluene: | 14.6 liters |
| dixylyl ethane: | 42.4 liters |

Inhibitors are removed from the above mixture and the following catalyst system added:

| | |
|---|---|
| bis(4-tertiary-butyl-cyclohexyl) peroxydicarbonate: | 1000 grams |
| dilauroyl peroxide: | 1000 grams |
| dibenzoyl peroxide: | 995 grams |

The resulting mixture is de-oxygenated and fed to an apparatus corresponding to FIGS. 1 and 2 by conduit means 14. Films 11 and 11' are 46 inches wide Mylar type M. The substrate is a modacrylic fabric similar in construction to that used in Example 1. Element 16a is inert and exerts a pressure of about 4 grams per cm² on sandwich S. Elements 16b and d are fans, regulated manually to control the temperature of sandwich S. Elements 16c and e are inert and exert a pressure of about 0.6 gram per cm² on sandwich S. Elements 16f and g are omitted. Elements 16i through p are heated electrically to cause the temperature of sandwich S to increase from about 80° to about 115° C. The speed of sandwich S is adjusted to give a polymerization time of about 25 minutes. Sandwich S is separated from elements 16a through e and h through p by abherent Kapton film anchored to the apparatus. Means 12a and 12'a at the near edges of films 11 and 11' as indicated in FIG. 1 and the corresponding sealing means at the far edges of said films, means 13, 15a and b, 19a and b are similar in specifications to those used in Example 1. The edges of sandwich S are slit by element 17a and a corresponding element at the far edge of sandwich S and films 20 and 20' are taken up by rolls 20a and 20'a respectively. Polymer sheet P is cut by shear 22 into lengths of about 18 inches each. The resulting polymer sheets are further processed as in Example 1. The cation exchange membranes thus prepared are about 0.56 mm thick, have cation exchange capacities of about 3.1 milligramequivalents per dry gram of sulfonated polymer in the sodium form (ex substrate), water contents of about 48 percent of the water saturated sulfonated polymer in the sodium form (ex substrate) and electrical resistivities per unit area of about 10 ohm cm² at 1000 Hz when in equilibrium with aqueous 0.01N NaCl at room temperature. They are useful for the electrodialytic treatment of brackish water to make potable water.

EXAMPLE 4

Example 1 is repeated except the polymerization initiator system consists of about:

| | |
|---|---|
| 2-(Tertiary butyl azo)-4-methoxy-2,4-dimethyl pentane nitrile: | 370 grams |
| 2,2'-azobis(isobutyronitrile): | 170 grams |
| 2-(tertiary-butylazo)isobutyro nitrile: | 260 grams | and the temperature of the sandwich S ranges from about 65° to about 115° C. The speed of the sandwich is adjusted to give a polymerization time of about 25 minutes. The finished cation exchange membranes have about the same properties as those prepared according to Example 1 and are useful for the production of potable water from brackish by electrodialysis.

EXAMPLE 5

Example 4 is repeated except the polymerixation system consists of:

| | |
|---|---|
| benzoin propyl ether: | 100 grams |
| 2,2'-azobis(isobutyronitrile): | 170 grams |
| 2-(tertiary-butylazo)isobutyro nitrile: | 260 grams | and element 16a comprises medium pressure mercury arc lamps rated at 80 watts per centimeter of arc. Elements 16i and j are water cooled to control the temperature to less than about 115° C. In addition air is blown over the upper surface of the sandwich, under element 16a. Element 16b is inert and exerts a pressure of about 4 grams per cm² on the sandwich. Elements 16c, e and g are manually controlled fans. Elements 16d and f are inert and exert a pressure of about 0.6 grams per cm² on the sandwich S. Element 16h is omitted. Elements 16k through p are electrically heated as required so that the final temperature of the sandwich opposite element 16p is about 115° C. The abherent film is omitted between elements 16a and sandwich S. The polymer sheets are converted to cation exchange membranes as described in Example 1. The properties are about the same as in that example and the membranes are useful for the electrodialytic treatment of brackish water to produce potable water.

EXAMPLE 6

The apparatus films and substrate of Example 1 are used. A liquid characterized by having a viscosity less than about 10 poise at shear rates in excess of about 1 cm/sec and comprising at least in part components reactable to form polymer is prepared from about:

| | |
|---|---|
| 2-(tertiary butyl azo)-4-methoxy-2,4-dimethyl pentane nitrile: | 185 grams |
| 2,2'-azobis(isobutyronitrile): | 85 grams |
| 2-(tertiary-butyl azo) isobutyro nitrile: | 260 grams |

The temperature of the sandwich is controlled in the range of from about 65° to about 115° C. The speed of sandwich S is adjusted to give a polymerization time of about 25 minutes. The cut polymer sheets are interleaved with Mylar film and cured in an oven at 115° C. after which the sheets are leached for several days in 2 normal hydrochloric acid. The sheets are found to be anion exchange membranes having a low transport number for hydrogen ions in hydrochloric acid solutions having concentrations in the range of from about 0.5 to 1.0 normal. They are useful in the electrodialytic recovery of acids having a low formula weight.

EXAMPLE 7

The apparatus of Example 1 (and FIGS. 1 and 2) is rearranged as follows: A second roll of substrate (not shown) is arranged to feed a second substrate (not shown) between substrate 10 and conduits 14 and 14b; a third roll of foil (11"a, not shown) is arranged to feed a third foil between substrate 10 and the second substrate; a second group of conduits are arranged to enter the pocket between foil 11 and substrate 10 (conduits 14 and 14b not entering the pocket between the second substrate and foil 11'). Foils 11, 11' and the third foil are Mylar Type M 3 mils thick and 24" wide. Substrate 10 and the second substrate are acrylic plain weave fabric 20 inches wide as described in Example 1. 80 liters of liquid having components reactable to form polymer are prepared as in Example 1. Elements 16a through p are arranged as described in that example. The temperature of the multiple sandwich increases from about 60° C. at element 16i to about 110° C. at element 16n. The linear velocity of the multiple sandwich is adjusted to give a polymerization time of about 25 minutes. Films 20 and 20' (i.e. 11 and 11') are taken up by rolls 20a and 20'a respectively. The resulting two polymer sheets separated by the third foil are cut by shear 22 into lengths of about 40 inches each. The resulting sheets are converted to cation exchange membranes as described in Example 1. The electrochemical properties are about the same as those prepared according to Example 1. The membranes are useful for the production of potable water from brackish water by electrodialysis.

EXAMPLE 8

The apparatus and process of Example 1 are used except the linear velocity is doubled and film 20' (i.e. film 11') is not stripped from polymer sheet P and is sheared off with sheet P by shear 22. The polymerizable liquid in sheet P is found to be at least gelled but not completely polymerized. The "half" sandwiches of sheared foil 20' and sheet P are stacked up and heated in a hot air oven at about 110° C. until the polymerization is substantially complete. By such means the capacity of the apparatus of Example 1 is doubled. The resulting polymer sheets are converted to cation exchange membranes as described in Example 1 and found to have about the same electrochemical properties and to be useful also for the production of potable water by electrodialysis of brackish water.

EXAMPLE 9

The apparatus of Example 1 (and FIGS. 1 and 2) is used except: roll 10a consists of four plies of glass cloth about 20 inches wide (and substrate 10 is therefore four plies of glass cloth); roll 11'a is copper foil about 1.3 mils thick and 24 inches wide treated on the outer surface with a silane coupling agent; elements 16a through h are inert and exert a pressure of about 4 grams per sq. cm. on the sandwich; elements 16i through p are heated and controlled to give a temperature of about 130° C. in the sandwich; means 12a and 12'a at the rear edges of foils 11 and 11' as shown in FIG. 1 and the corresponding sealing means at the far edges of said foils apply adhesive to the foils and bind them together. A liquid characterized by having a viscosity less than about 10 poise at shear rates in excess of about 1 cm/sec and comprising at least in part components reactable to form polymer is prepared from about:

| | |
|---|---|
| liquid epoxy resin(Epikote 828, Shell International Chemical Co., London, England) | 50 kg |
| methyl-tetrahydrophthalic anhydride | 40 kg |

The mixture is thoroughly deaerated by pumping into a vacuum chamber having a pressure of about 2 mm Hg absolute after which 250 grams of benzyl dimethylamine are added. The linear velocity of the sandwich was adjusted to give a polymerization time of about 1 hour. Foils 20 and 20' (i.e. foils 11 and 11' are not stripped from polymer sheet P. Instead the entire sandwich is cut into sheets about 40 inches long which are stacked up and further cured in a hot air oven at about 180° C. After cooling the stack is disassembled and the Mylar foil removed from sheets P, the copper foil remaining in place. The resulting polymer sheets laminated to copper foil are useful as printed circuit boards.

In some of the above examples dixylyl ethane was used as an inert, leachable diluent. Other such diluents may be used e.g. diethyl benzene, decalin (decahydronaphthalene), tetralin(tetrahydronaphthalene), dialkyl phthalates, the dialkyl esters of dicarboxylic acids such as adipic, azelaic or sebacic acid, the triaryl or alkyl diaryl esters of phosphoric acid, the trialkyl esters of trimellitic acid, glycerol triacetate. An appropriate diluent should be substantially leachable, a solvent for the components-reactable-to-solid-polymers, generally a swelling agent for such solid polymers (unless reticulated solid polymers are desired), a poor swelling agent or solvent for the foils and substrates under the temperature-time conditions existing during manufacture. The combination of foils, substrate(s) and liquid comprising in part components reactable to solid polymer (including any polymerization initiators or catalysts) may be regarded as an interacting system. Thus in addition to the requirement that the foils and substrate(s) not be substantially swollen by the liquid under process conditions the liquid during polymerization should not at point during the process exert a vapor pressure equal to or greater than atmospheric pressure at the site. Further the liquid may contain wetting agents (such as salts of alkylarene sulfonic acids) to assist penetration of the liquid into the foramina of the substrate(s) or such substrate may be pre-treated with such wetting agents. The liquid may as well contain viscosity controlling agents such as soluble elastomers (e.g. butadiene-styrene copolymers) or calcium or aluminum fatty acid soaps to assist retention of said liquid by the sandwich of foils and substrate(s) under gravitational and other stresses. Particularly useful are thixotropic agents which produce viscosities of less than about 10 poise at shear rates in excess of about 1 cm/sec and higher viscosities at lower shear rates. Some additives tend to give other desirable properties to the finished polymer sheets e.g. linear polymers (such as the butadiene-styrene copolymers mentioned above) result in polymer sheets which are tougher and less brittle.

In this specification and the appended claims continuous is not meant to imply that the apparatus and/or process operation without cessation or interruption but rather that the time of operation is long with respect to time of polymerization of a given moiety of liquid in the apparatus. The word quasi-continuous is used herein to imply such latter sense. It will be obvious that the apparatus and process may be shut down to change the various rolls 10a, 11a, 11'a, 20a and 20'a or toward the end of a shift or at the end of a planned production run without departing from the spirit of the invention.

It will be understood that the embodiments described herein are merely exemplary and that a person skilled in the art may make many variations and modifications without departing from the spirit and scope of the invention. All such modifications and variations are intended to be included within the scope of the invention as defined in the appended claims.

We claim:

1. Apparatus for saturating foraminous substrates with fluid polymerizable liquid and subsequently polymerizing said liquid, said apparatus comprising:
   (a) at least first, second and third roll support means, said first and third roll support means adapted to hold rolls of foil in substantially horizontal orientations, said second roll support means adapted to hold rolls of substrate in substantially horizontal orientations, said first, second and third roll support means presenting at least some resistance to the unwinding of said rolls of foil and substrate and positioned to permit substrate from said second roll support means to be unwound between foil unwound from said first and third roll support means;
   (b) foil and substrate juxtapositioning means adapted to form a substantially vertically oriented, quasi-continuous sandwich by substantially vertically orienting, quasi-continuously substrate from said second roll support means, aligning and juxtaposing foil from said first roll support means on one side of said substrate and aligning and juxtaposing foil from said third roll support means on the other side of said substrate;
   (c) positioned substantially vertically below said juxtapositioning means are nipping means adapted to squeeze the sandwich formed by said juxtapositioning means to a thickness substantially equal to the sum of the nominal thicknesses of the foil from said first and third roll support means and the substrate from said second roll support means;
   (d) positioned substantially vertically below said juxtapositioning means and substantially vertically above said nipping means are sealing means adapted with said nipping means to form a substantially vertically oriented substantially leak-proof pocket in the sandwich formed by said juxtapositioning means by joining the lateral edges of the foil from said first roll support means to the juxtaposed lateral edges of the foil from said third roll support means from substantially said sealing means at least to said nipping means;
   (e) at least one conduit means adapted to convey liquid into said pocket formed by said sealing means and said nipping means;
   (f) flow control means adapted to maintain the upper surface of said liquid in said pocket at a level which is substantially higher than said nipping means;
   (g) traction means adapted to pull, at a substantially uniform linear velocity, foil from said first and third roll support means and substrate from said second roll support means through said juxtapositioning means, sealing means and nipping means in series and in a substantially horizontal direction after said nipping means; and
   (h) between said traction means and said nipping means, a polymerization zone comprising sandwich support means adapted to maintain the said sandwich pulled by said traction means from said nipping means in a substantially horizontal orientation, said sandwich support means having a length which is at least sufficient for any fluid, polymerizable liquid in said sandwich pulled from said nipping means to cure at least to the glassy, gel or solid state.

2. Apparatus according to claim 1 in which said polymerization zone also comprises one or more polymerization controlling means selected from the group consisting of heating means, cooling means and irradiating means.

3. Apparatus according to claim 1 in which there is positioned after said nipping means, unsealing means adapted to disjoin the lateral edges of the foil from said first roll support means from the lateral edges of the foil from said third roll support means.

4. Apparatus according to claim 1 in which there is positioned after said polymerization zone, a fourth roll support means adapted to separate foil from at least one of said first and third roll support means from substrate from second roll support means and to wind up the separated foil on said fourth roll support means, said fourth roll support means imparting at least some tension to the separated foil.

* * * * *